US006111540A

United States Patent [19]
Krasner

[11] Patent Number: 6,111,540
[45] Date of Patent: Aug. 29, 2000

[54] COMBINED GPS POSITIONING SYSTEM AND COMMUNICATIONS SYSTEM UTILIZING SHARED CIRCUITRY

[75] Inventor: Norman F. Krasner, San Carlos, Calif.

[73] Assignee: SnapTrack, Inc., San Jose, Calif.

[21] Appl. No.: 09/343,124

[22] Filed: Jun. 29, 1999

Related U.S. Application Data

[63] Continuation of application No. 08/652,833, May 23, 1996, Pat. No. 6,002,363, which is a continuation-in-part of application No. 08/612,669, Mar. 8, 1996, Pat. No. 5,663,734, which is a continuation-in-part of application No. 08/612,582, Mar. 8, 1996, Pat. No. 5,874,914, which is a continuation-in-part of application No. 08/613,966, Mar. 8, 1996.

[51] Int. Cl.$^7$ .............................. H04B 7/185; G01S 5/02
[52] U.S. Cl. ............................... 342/357.1; 342/357.09; 701/213
[58] Field of Search ........................... 342/357.09, 357.1; 701/213

[56] References Cited

U.S. PATENT DOCUMENTS

| | | | |
|---|---|---|---|
| 4,445,118 | 4/1984 | Taylor et al. ........................... | 343/357 |
| 4,601,005 | 7/1986 | Kilvington .............................. | 364/602 |
| 4,701,934 | 10/1987 | Jasper .................................... | 375/1 |
| 4,785,463 | 11/1988 | Jane et al. .............................. | 375/1 |
| 4,797,677 | 1/1989 | MacDoran et al. .................... | 342/352 |
| 4,959,656 | 9/1990 | Kumar ................................... | 342/418 |
| 4,998,111 | 3/1991 | Ma et al. ............................... | 342/352 |
| 5,043,736 | 8/1991 | Darnell et al. ......................... | 342/357 |
| 5,202,829 | 4/1993 | Geier ..................................... | 364/449 |
| 5,223,844 | 6/1993 | Mansell et al. ........................ | 342/357 |
| 5,225,842 | 7/1993 | Brown et al. .......................... | 342/357 |
| 5,271,034 | 12/1993 | Abaunza ................................. | 375/1 |
| 5,311,194 | 5/1994 | Brown .................................... | 342/357 |
| 5,317,323 | 5/1994 | Kennedy et al. ...................... | 342/357 |
| 5,323,163 | 6/1994 | Maki ...................................... | 342/357 |
| 5,365,450 | 11/1994 | Schuchman et al. .................. | 364/449 |
| 5,379,047 | 1/1995 | Yokev et al. .......................... | 342/457 |
| 5,379,224 | 1/1995 | Brown et al. .......................... | 364/449 |
| 5,379,320 | 1/1995 | Fernandes et al. .................... | 375/1 |
| 5,416,797 | 5/1995 | Gilhousen et al. .................... | 375/705 |
| 5,420,592 | 5/1995 | Johnson ................................. | 342/357 |
| 5,423,076 | 6/1995 | Westergren et al. .................. | 455/86 |
| 5,430,759 | 7/1995 | Yokev et al. .......................... | 375/202 |
| 5,455,823 | 10/1995 | Noreen et al. ......................... | 370/50 |
| 5,483,549 | 1/1996 | Weinberg et al. ..................... | 375/200 |
| 5,497,149 | 3/1996 | Fast ....................................... | 340/988 |
| 5,544,061 | 8/1996 | Morimoto et al. . | |
| 5,574,469 | 11/1996 | Hsu ....................................... | 342/455 |
| 5,594,454 | 1/1997 | Devereux et al. ..................... | 342/357 |
| 5,717,403 | 2/1998 | Nelson et al. ......................... | 342/357 |

FOREIGN PATENT DOCUMENTS

| | | |
|---|---|---|
| 2177310 | 12/1996 | Canada . |
| 0512789A2 | 11/1992 | European Pat. Off. . |
| 0604404A2 | 6/1994 | European Pat. Off. . |

OTHER PUBLICATIONS

PCT International Search Report sent on Feb. 21, 1997.

*Primary Examiner*—Theodore M. Blum
*Attorney, Agent, or Firm*—Blakely, Sokoloff, Taylor & Zafman

[57] ABSTRACT

A combined GPS and communication system having shared circuitry. The combined system includes an antenna for receiving data representative of GPS signals, a frequency converter coupled to the antenna, a frequency synthesizer coupled to the frequency converter, an analog to digital converter coupled to the frequency converter and a processor coupled to the frequency converter. The processor processes the data representative of GPS signals to determine a pseudorange based on the data representative of GPS signals. The integrated communication receiver includes a shared component which is at least one of the antenna, the frequency converter, the frequency synthesizer and the analog to digital converter. Typically, in certain embodiments the processor also demodulates communication signals received as well as controls the modulation of data to be transmitted as a communication signal through a communication link.

18 Claims, 11 Drawing Sheets

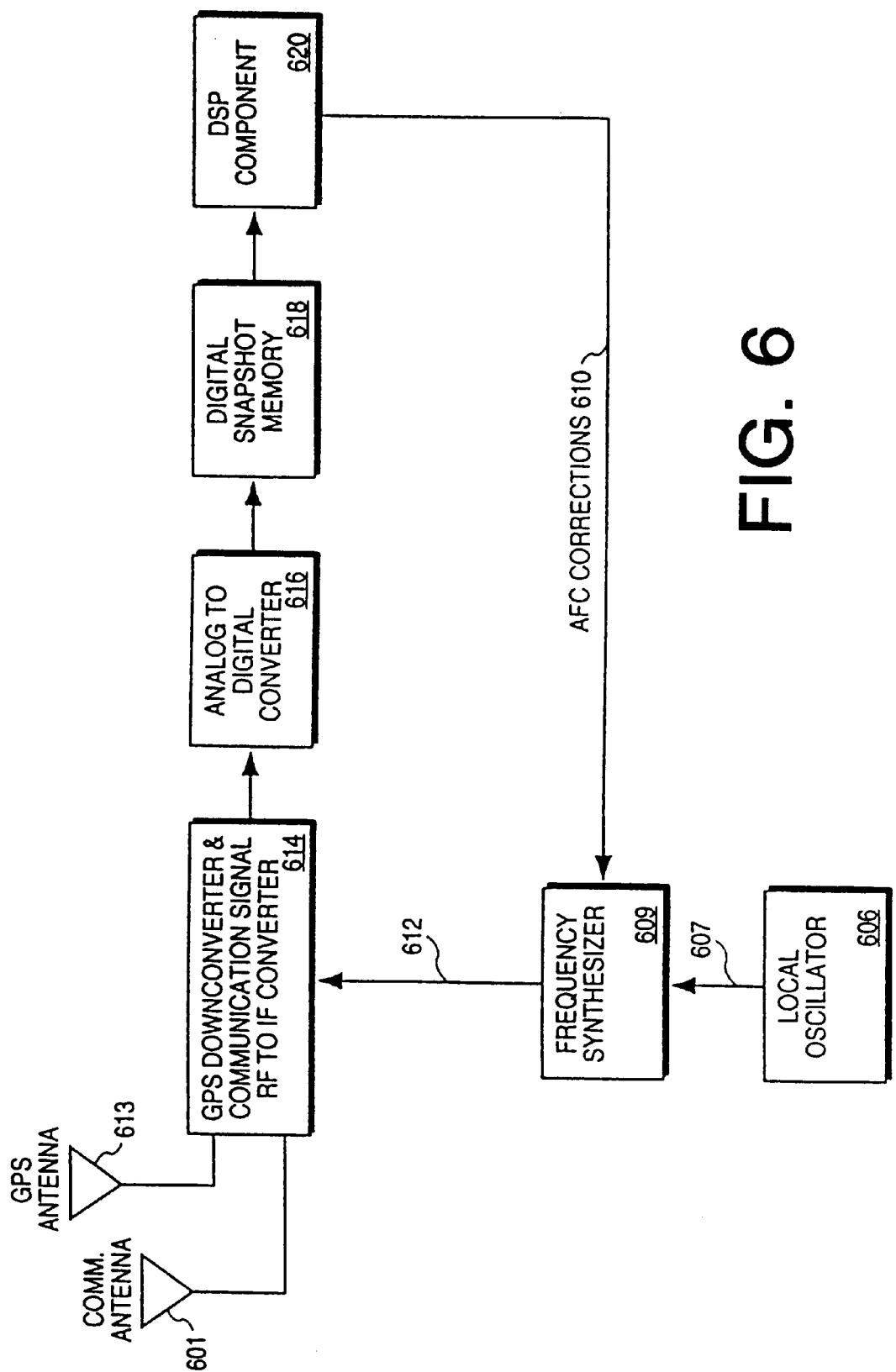

COMBINED GPS POSITIONING SYSTEM AND COMMUNICATIONS SYSTEM UTILIZING SHARED CIRCUITRY

This application is a continuation of application Ser. No. 08/652,833, filed May 23, 1996, which is now U.S. Pat. No. 6,002,363.

BACKGROUND OF THE INVENTION

This application is a continuation in part of three patent applications filed by the same inventor, Normal F. Krasner, on Mar. 8, 1996, these three applications being: An Improved GPS Receiver and Method for Processing GPS Signals (Ser. No. 08/612,669) now U.S. Pat. No. 5,663,734; An Improved GPS Receiver Utilizing a Communication Link (Ser. No. 08/612,582) now U.S. Pat. No. 5,874,914; An Improved GPS Receiver Having Power Management (Ser. No. 08/613,966).

FIELD OF THE INVENTION

The present invention relates to receivers which perform the dual functions of (a) determining their position by means of reception of transmission from global positioning satellite systems and (b) performing communications to and from other locations in order to receive position location commands and other information and transmit in return data representative of position information which was found through reception of transmissions from global positioning satellite systems.

BACKGROUND ART

The combination of GPS systems and other communications systems is receiving considerable interest, especially in the areas of personal and property tracking. An example of such a combination is shown in U.S. Pat. No. 5,225,842. The communication link allows an inexpensive GPS (Global Positioning System) receiver located on a mobile person or object (for example, a vehicle or animal) to transmit its accurately determined position to remote locations which monitor this activity. Applications of this technology include security, truck fleet tracking, emergency response, inventory control, etc. The prior art has performed such combinations by mating separate GPS receivers and communication systems using suitable electronic interfaces between the two, for example, serial communication ports, etc. Common housings and a common power supply are often shared in order to reduce over all cost. Nevertheless, the prior art provides systems utilizing separate circuitry to perform the GPS and communication functions.

It has heretofore been impractical to combine much of the circuitry of the two different systems since all known GPS receivers utilize specialized hardware, called "correlators", to process the received signals from a multiplicity of satellites. This specialized hardware differs markedly from that used in communications receivers and transceivers such as cellular telephones and pagers. In many communication receivers, such as those found in cellular telephones and pagers, signal processing functions are performed using general purpose digital signal processing integrated circuits, such as the TMS 320 family from Texas Instruments. Accordingly, the signal processing hardware of the two different systems are incompatible in a combined GPS and communication system.

SUMMARY OF THE INVENTION

The present invention provides a combined apparatus which is typically a mobile system having a GPS receiver and an integrated communication receiver. In a typical embodiment, the system comprises the GPS receiver which includes a GPS antenna for receiving data representative of GPS signals and includes a processor, such as a digital processor, coupled to the GPS antenna to receive the data representative of GPS signals and to process these signals in order to provide, at least in one embodiment, pseudorange information. The processor, such as a digital processor, also processes communication signals received through a communication link such that the processor typically demodulates the communication signals which are sent to the combined system. In this manner, the processing of GPS signals as well as communication signals is performed in a processor which is shared between the two functions.

In an alternative embodiment, a mobile system having a GPS receiver and an integrated communication system, such as a communication receiver, includes an antenna for receiving data representative of GPS signals, a frequency converter coupled to the antenna, a frequency synthesizer coupled to the frequency converter, an analog to digital converter coupled to the frequency converter, and a digital processor coupled to the frequency converter. This digital processor processes data representative of GPS signals received through the antenna to determine pseudorange information based on the data representative of GPS signals. The integrated communication receiver includes a shared component which is shared with the GPS system, such as the antenna, the frequency converter, the frequency synthesizer, the digital processor, a memory which is coupled to the digital processor or the analog to digital converter.

The present invention also provides a method for controlling a communication link and processing data representative of GPS signals in a combined system. This method includes, in a typical embodiment, the processing of data representative of GPS signals in a processing unit and the controlling of communication signals through a communication link by using the processing unit to perform the controlling step, wherein the processing unit performs demodulation of communication signals sent to the GPS receiver.

In a typical embodiment of the present invention, the GPS operation and the communications reception/transmission operation are performed at different times, which facilitates the use of common (shared) circuitry. In addition, the signal processing operations for the GPS signals is performed typically in a programmable digital signal processing (DSP) integrated circuit using Fast Fourier Transfer algorithms together with other data compression methods. This approach provides superior acquisition time and receiver sensitivity compared with traditional correlator based approaches in traditional GPS receivers. It will be appreciated that these methods for processing GPS signals are compatible with programmable DSP implementation on such DSP integrated circuits, and these same circuits may be used to implement communication demodulators based upon similar approaches.

BRIEF DESCRIPTION OF THE DRAWINGS

The present invention is illustrated by way of example and not by way of limitation in the figures of the accompanying drawings in which references indicate similar elements and in which:

FIG. 6 illustrates a GPS mobile unit having, according to one aspect of the present invention, a local oscillator correction or calibration.

DETAILED DESCRIPTION OF THE PRESENT INVENTION

The present invention relates to methods and devices for performing dual functions in a combined system using shared circuitry where the functions include (a) position determination via GPS signal processing and (b) communication to and from other locations via a radio frequency communication link. By sharing circuitry for these functions such that the shared circuitry performs at least a portion of both of these functions, the system may have reduced power dissipation and reduced size and cost. Moreover, the complexity related to interfacing such systems may be reduced.

Figure 1A:
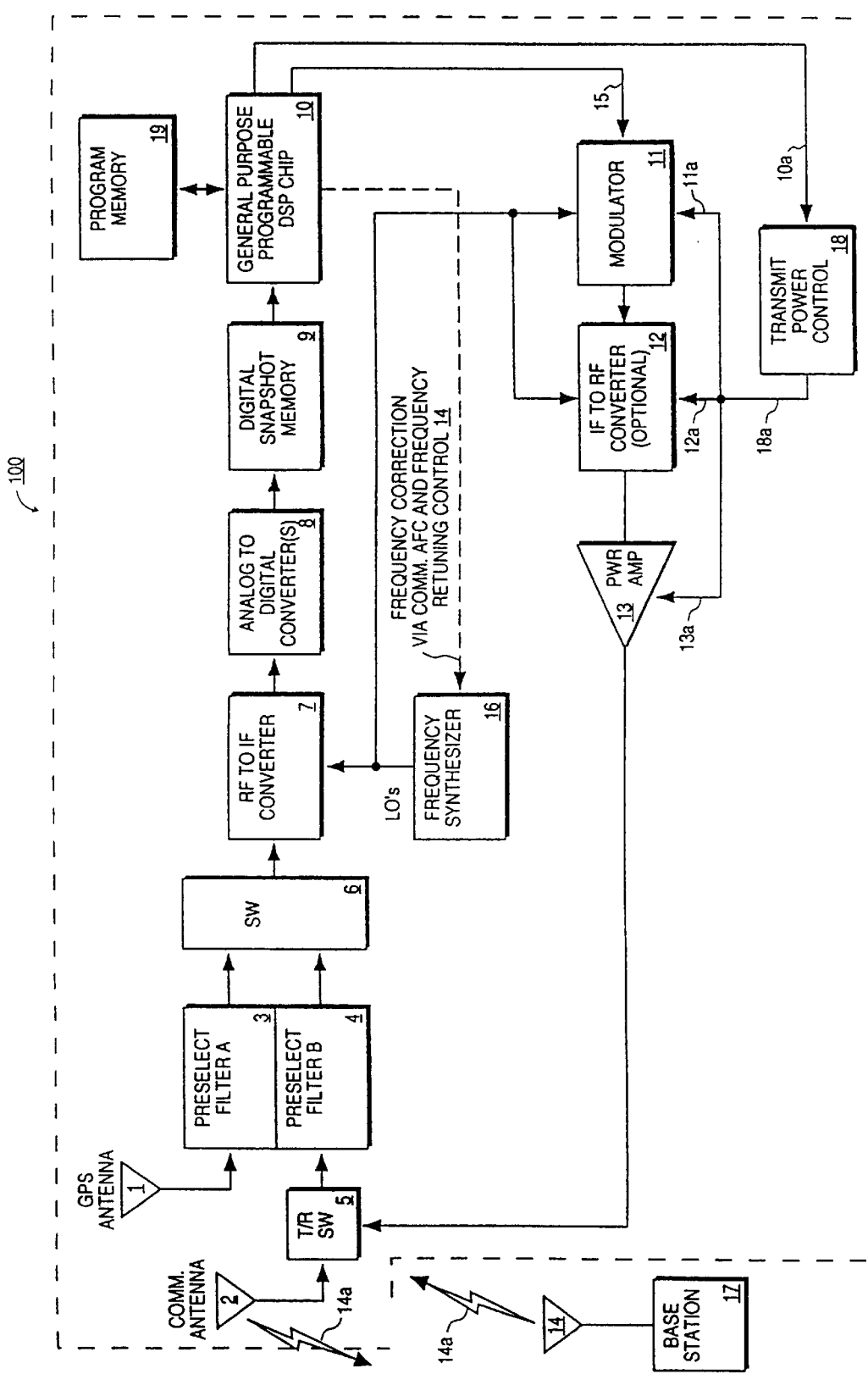
FIG. 1A is a block diagram of the major components of a mobile combined system having a GPS reception system as well as a communication system which can establish a communication with a basestation.

An example of a combined GPS and communication system having shared circuitry is shown in FIG. 1A. A combined mobile unit 100 includes circuitry for performing the functions required for processing GPS signals as well as the functions required for processing communication signals received through a communication link. The communication link, such as communication link 14a, is typically a radio frequency communication link to another component, such as a basestation 17 having a communication antenna 14. The combined mobile unit 100 includes a GPS antenna 1 and a communication antenna 2 which are coupled to a switch 6 through preselect filters 3 and 4 as shown in FIG. 1A. Depending upon whether a GPS signal or communication signal is being transmitted/received, one of the two antennas 1 or 2 is selected via the switch 6. Separate preselection filters 3 and 4 are used to remove interference outside of the particular signal band. One such band corresponds to that of the GPS signals from antenna 1, and the other band to the band where the communication signals reside. In some special cases, it is possible to use a single antenna if the GPS signals and communication signals are closely spaced in frequency. It will be appreciated that the switch 6 selects the signal from the preselect filter 3 for input to the RF to IF converter 7 when the GPS signals are being collected in accordance with the present invention. When communication signals from the communication link 14a are being collected for demodulation, the switch 6 selects the signal from the preselect filter 4 for input to the converter 7.

Figure 1B:
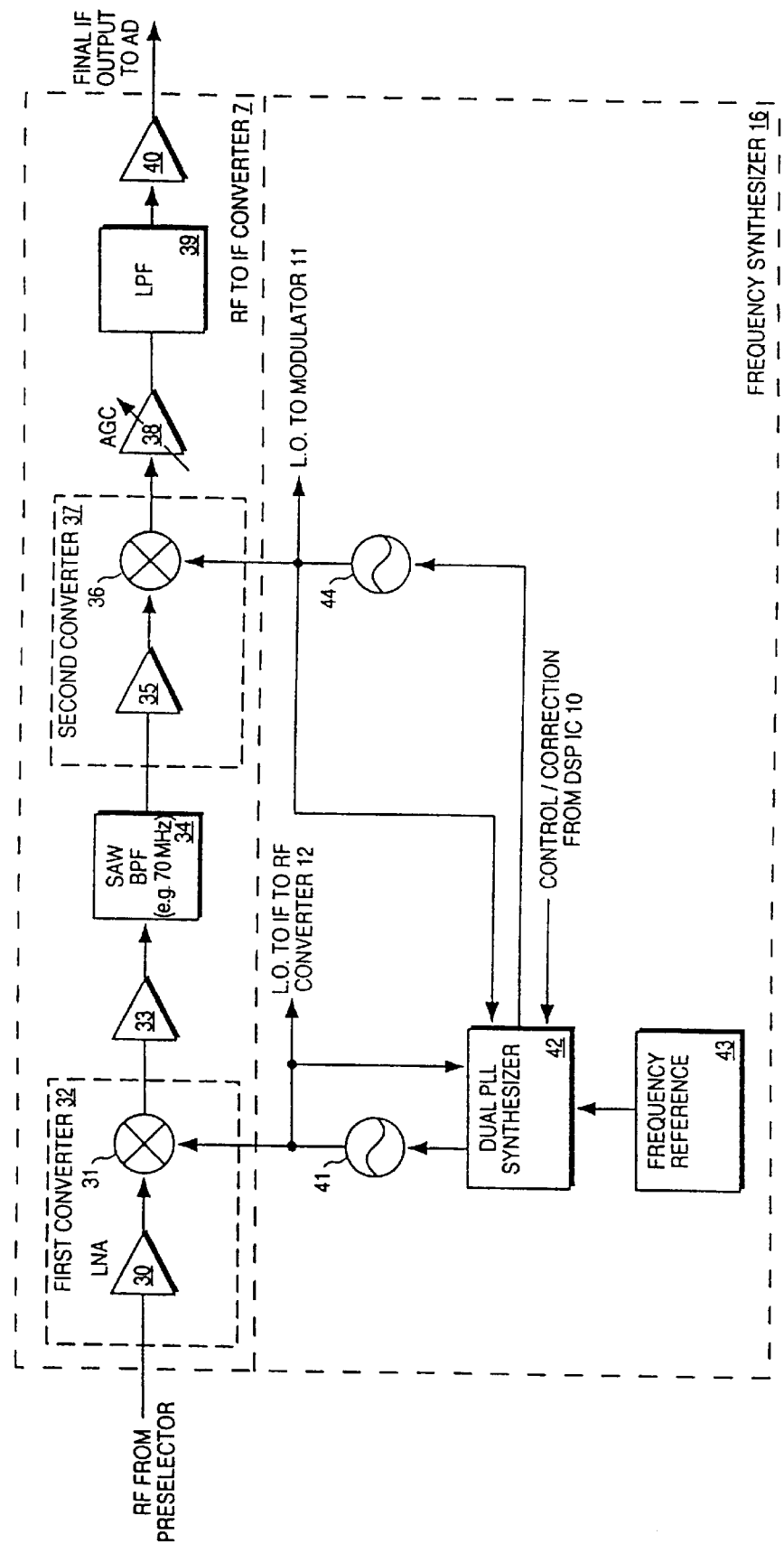
FIG. 1B shows a block diagram of a typical implementation for the RF to IF converter and frequency synthesizer of FIG. 1A.

The output of the switch 6 is coupled to an input of the radio frequency (RF) to intermediate frequency (IF) converter 7. This converter 7 translates the signal to a suitable intermediate frequency, for example 70 MHz. It then provides a further translation to a lower intermediate frequency, for example 1 MHz. Each converter within the RF to IF converter 7 typically consists of an amplifier and a mixer, as shown in FIG. 1B. The components of the first converter are normally sufficiently wide band to encompass a wide frequency range (for example 800 to 2000 MHz) and for most cases are sufficiently broad band to handle the frequency ranges spanned by the GPS signals and the most important communication signals.

The output of the RF to IF converter 7 is coupled to the input of an analog to digital (A/D) converter 8, which digitizes the output signals from the Rf to IF converter 7. In some implementations, the RF to IF converter 7 provides a pair of outputs that are in phase quadrature; in such cases, two AND Converters may be employed. The output from the A/D Converter 8 is coupled to an input of the digital snapshot memory 9 which can store the record of data to be processed. In some cases this memory 9 may be bypassed and the data sent directly to the processor component 10 (which may be a DSP chip as shown or a set of digital processing chips) if the data rate output from the AND Converter 8 is sufficiently low. The snapshot memory 9 is typically used in processing the GPS signals which are typically stored in the memory 9. The snapshot memory 9 is also normally employed for communication signals that are packetized—that is, signals consisting of bursts of data bits followed by long periods of inactivity. This is the primary form of communication signaling envisioned to be used with the present invention. However, continuous signaling, such as many cellular type signals, may be processed in a continuous manner by the processor 10.

The memory 9 is bidirectionally coupled to the processor 10 in a typical embodiment in order for the processor to read and write data to the memory 9. In one embodiment the memory 9 may be conventional dual port memory, having one input port coupled to receive output from the A/D converter 8 and another input port coupled to receive data from processor 10.

It will be appreciated that the processing component 10 receives communication signals sent through the communication link 14a by converting the communication signals in converter 7 and digitizing those signals through converter 8 and storing the signals in memory 9 or processing them directly. In this fashion, the processor. 10 demodulates the communication signal in order to determine the commands in the communication signal or other data (e.g. Doppler data or data representative of ephemeris of satellites in view) in the communication signal.

When a transmission is required through the communication link, the processor 10 generates the data to be transmitted and baseband digital samples of the signal. It then uses this data to modulate a carrier signal using a modulator circuit 11. Such modulation is often a digital type, such as frequency shift keying or phase shift keying. Analog modulation, such as frequency modulation, may also be used. The carrier frequency at which the modulation is performed may or may not be at the final RF frequency of the communication signal; if it is at an intermediate frequency (IF), then an additional IF to RF converter 12 is employed to translate the signal to a final RF frequency for the communication signal. A power amplifier 13 boosts the signal level, and this boosted signal is then fed to the communication antenna 2 through a transmit/receive (T/R) switch 5 whose purpose is to isolate the sensitive receiver stage from the strong signal levels output from the power amplifier 13. In this manner, a communication signal containing data representative of position information (e.g. pseudoranges to various satellites or a latitude and longitude of the combined mobile unit 100) is transmitted to a basestation, such as basestation 17 through communication link 14a.

It may be appreciated that, at least in one embodiment, the same frequency synthesizer is used to produce the local oscillators for all operational modes; those modes include the reception of data representative of GPS signals, the reception of communication signals from the communication link 14a and the transmission of communication signals to the communication link 14a. It should be also be noted that the RF to IF converter 7, the analog to digital converter 8, the digital snapshot memory 9 and the processor chip 10 are common to all operational modes at least in one embodiment of the present invention. Of course, other peripheral circuitry such as power supplies, would normally be common to all such modes.

It will also be appreciated that, according to one embodiment of the present invention, a power management circuit may be implemented using power management algorithms stored in the memory 19 . These algorithms control the processor 10 which in turn controls the transmit power control 18. The transmit power control 18 provides a controlled power signal for the power amplifier 13, the converter 12 and the modulator 11 such that after transmission of a communication signal, the transmit power control unit 18 may cause modulator 11, converter 12 and amplifier 13 to enter a reduced power state. These components typically remain in this reduced power state until a further transmission through the communication link 14a is required. A typical example of this embodiment is a two-way pager system where the mobile unit 100 performs the functions of a two-way receiver and transmitter, and the transmitter is turned off (or otherwise consumes reduced power) when the transmitter is not transmitting.

FIG. 1B provides some additional details of the RF to IF converter 7 and its relationship to the frequency synthesizer 16, both of which are shown in FIG. 1B. A dual frequency synthesizer 42 as shown in FIG. 1B, is commonly available and is used to provide tunable local oscillators (L.O's). These may be tuned to accommodate the different RF frequencies for the different operational modes. The amplifier 30 in the first converter 32 receives the output from the switch 6 and amplifies that output to provide an input to the mixer 31 which also receives an input from the oscillator 41. The output from the mixer 31 is provided to an input of an amplifier 33, the output of which is coupled to the input of a bandpass filter (BFP) 34. The output from this filter 34 is coupled to the input of the second converter 37, which also includes an amplifier 35 and a mixer 36. The output from the mixer 36 is provided to an automatic gain control 38 which automatically controls the gain of the signal and provides an output to a low pass filter 39, the output of which is amplified by an amplifier 40 and provided as the output of the converter 7 to the input of the analog to digital converter 8. Local oscillators 41 and 44 provide the tuned frequencies for the two converters 32 and 37 in order to perform demodulation in the reception operational modes of the invention. These L.O.'s 41 and 44 also provide the tuned frequencies for the modulator 11 and the converter 12 in the transmission mode of the present invention. It will be appreciated that the use of a general purpose DSP integrated circuit chip (or several chips in a chip set) to process common communication signals is well known to those skilled in the art. As examples of such processing, one can refer to the data sheets of the parts TMS320CM545 and TMS320C546 from Texas Instruments of Dallas, Tex.; these data sheets describe the processing of GSM signals that are utilized in the European digital cellular networks.

When receiving a communications signal (e.g. from a basestation 17), the processor 10 causes the frequency synthesizer 16 to adjust its first local oscillator 41 to provide an output frequency which is a value either above or below the carrier frequency of the communications signal by an amount equal to the center frequency of the SAW filter 34. When receiving a GPS signal (e.g. from a GPS satellite) the processor 10 causes the local oscillator 41 to provide an output frequency which is a value either above or below the carrier frequency of the GPS signal (1575.42 MHz for the U.S. GPS system) by an amount equal to the center frequency of the SAW filter 34. In most situations, the second L.O. 44 will be tuned to the same frequency in both cases and thus the same final IF will be produced in both cases. It will be appreciated that, in a typical embodiment, the processor 10 will provide the control signals (e.g. via interconnect 14 shown in FIG. 1A) to the frequency synthesizer 16 in order to tune the oscillators (e.g. L.O. 41) for either GPS signal reception or communication signal reception. Similarly, the processor 10 will provide the control signals to the frequency synthesizer 16 when local oscillator signals are required for transmission of communication signals through modulator 11 and, optionally, converter 12.

Figure 2:
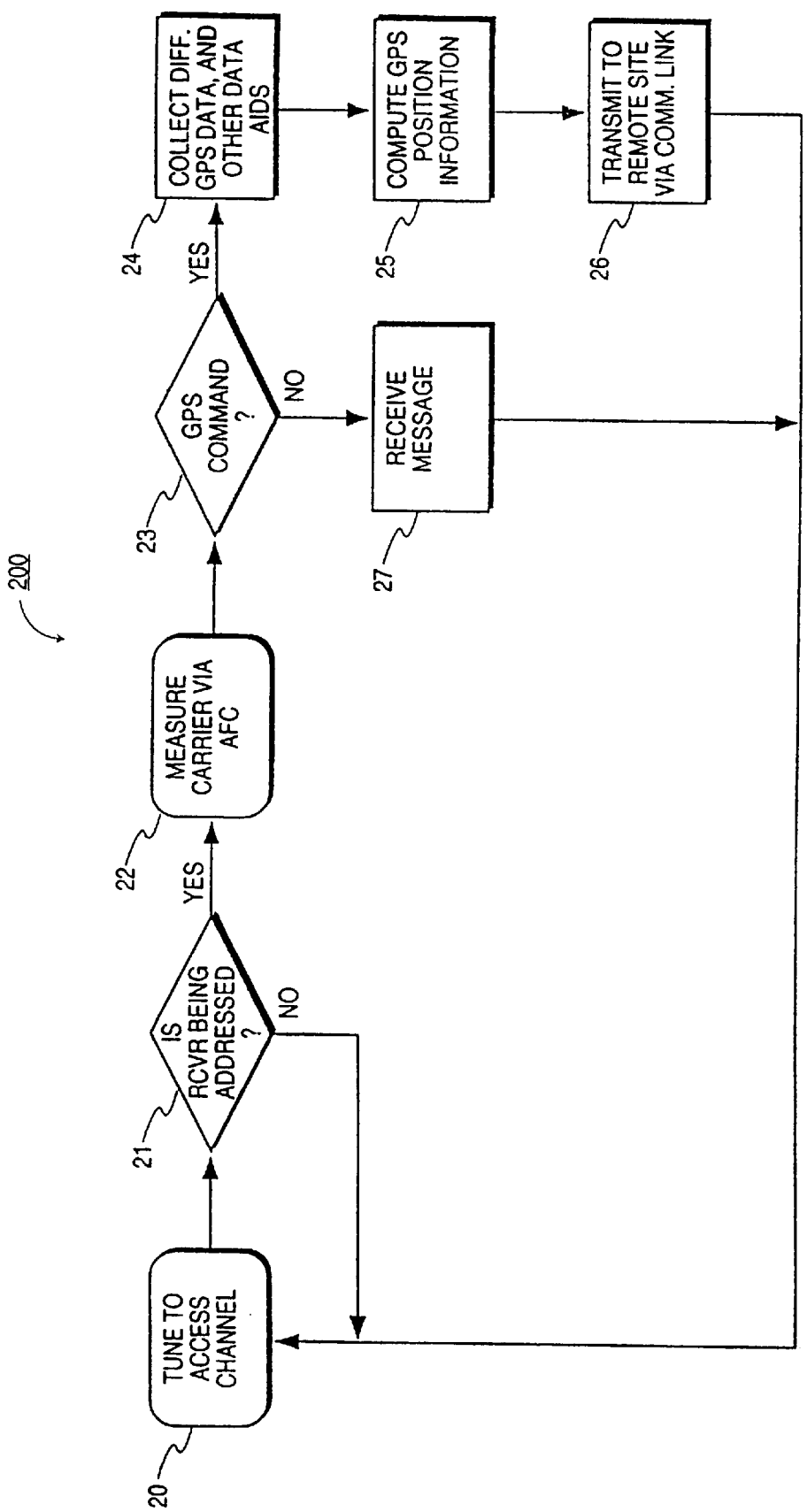
FIG. 2 illustrates a flow chart which indicates various processing steps in one embodiment of the present invention.

The flow chart of FIG. 2 shows an example of how the apparatus of FIG. 1A may be utilized in a typical operational scenario. In this situation, the receiver begins in a communications receiving mode such that communication signals from the communication link 14a are being monitored. Therefore, in step 20 the processor 10 tunes the converter 7 to the communication system access channel. This is a channel (typical of cellular networks) that broadcasts addresses of users for which there are messages and assigns such users to other channels in which they may communicate. If the receiver is being addressed in step 21, then the processor 10 tunes to the specified channel and, during its acquisition, measures the carrier frequency accurately in step 22. This is done in order to calibrate the local oscillator in the mobile system 100. If there is a command to determine position, which may be referred to as a GPS command as indicated in step 23, then this measurement of the carrier frequency allows the GPS receiver to compensate for local oscillator errors thereby speeding the acquisition of GPS signals. The receiver then enters the GPS mode, and Processor 10 retunes the receiver to the GPS band and collects and processes the GPS signals in step 24. It may use information supplied via the communication channel during the prior operation; such information may include satellite Doppler information, differential GPS data, data representative of satellite ephemeris for satellites in view, etc. In step 25, the processor 10 calculates position information from the GPS signals; typically, pseudoranges to the satellites in view are calculated at this time. Further details in connection with these procedures are described in the three above referenced patent applications filed by Norman F. Krasner on Mar. 8, 1996, and these three patent applications are hereby incorporated by reference. Following the position location operation in step 25, the system enters transmit mode 26, where it transmits position information to the communication link 14a. Depending upon the communication system and the time to perform the GPS position calculations, the same or different channel may be utilized as was employed during the reception of a message from the communication link 14a. If a different channel is employed, then the channel access procedure used during reception may be again utilized.

It will be appreciated by those in the art that the forgoing description is a typical flow according to one operational scenario. Other variations on this scenario may be practiced according to the invention. For example, a multiplicity of GPS measurements can be made between receptions or transmissions over the communication link; alternatively, a large number of communication messages may be passed back and forth over the communication link, with only occasional times allocated for processing of GPS signals.

The manner in which the processor 10 is used to process GPS signals for position location is now explained.

Figure 3:
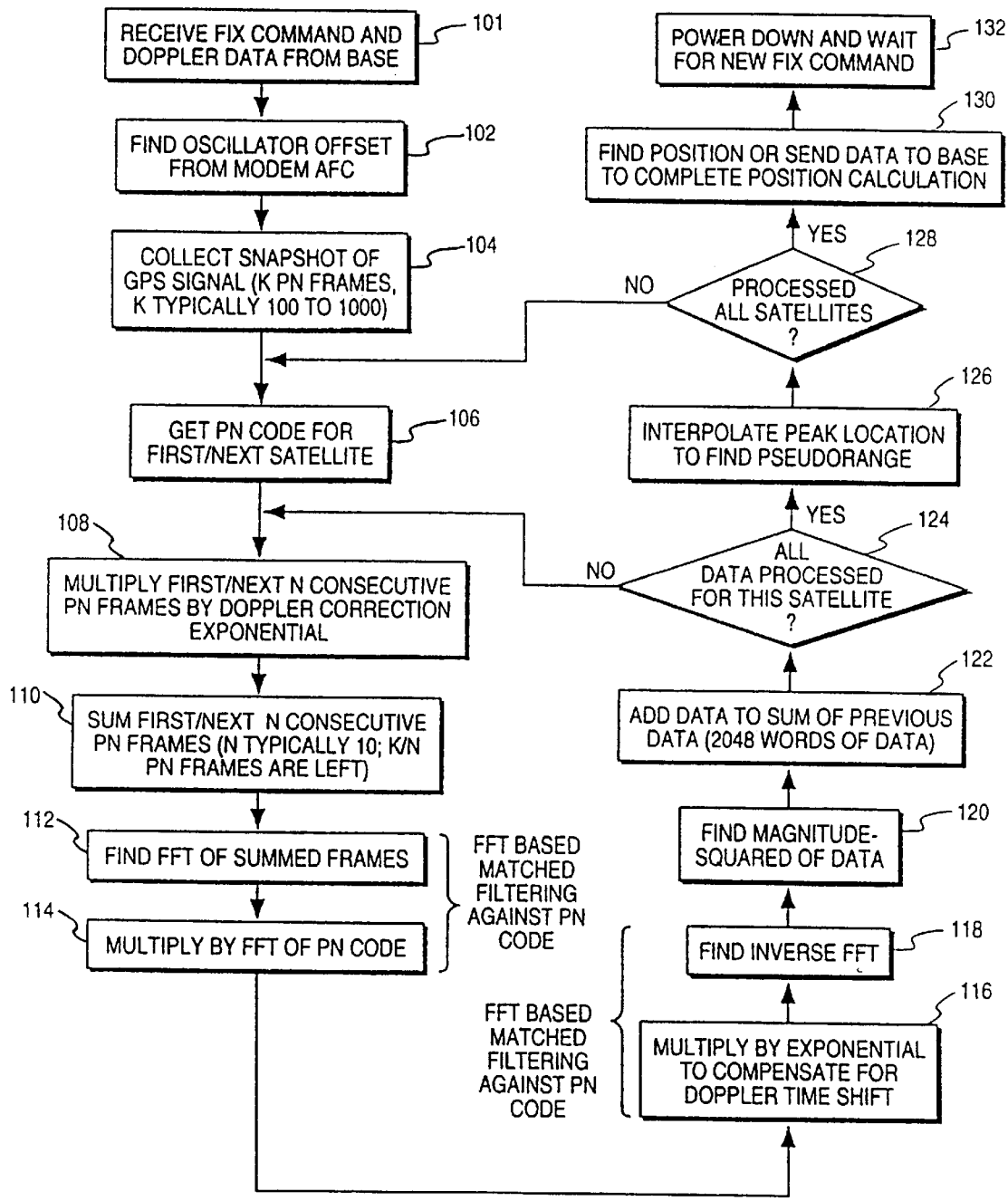
FIG. 3 shows a flow chart of the major operations performed by the DSP processor in accordance with one embodiment of the present invention.

Details of the signal processing performed in the DSP 10 may be understood with the aid of the flow chart of FIG. 3 and the pictorial of FIGS. 4A, 4B, 4C, 4D and 4E. It will be apparent to those skilled in the art that the machine code, or other suitable code, for performing the signal processing to be described is stored in memory 19. Suitable code for controlling reception and transmission of communication signals through a communication link (such as, for example, a two-way pager system) may also be stored in program memory 19. Other non-volatile storage devices could also be used. The objective of the GPS processing is to determine the timing of the received waveform with respect to a locally generated waveform. Furthermore, in order to achieve high sensitivity, a very long portion of such a waveform, typically 100 milliseconds to 1 second, is processed.

Figure 4A:
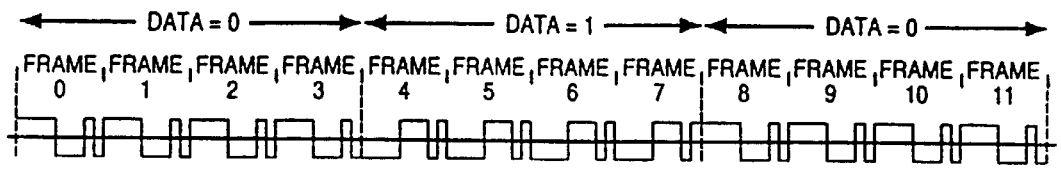
FIGS. 4A, 4B, 4C, 4D and 4E illustrate the signal processing waveforms at various stages of processing of GPS signals according to the methods of one embodiment of the present invention.

In order to understand the processing, one first notes that each received GPS signal (C/A mode) is constructed from a high rate (1 MHz) repetitive pseudorandom (PN) pattern of 1023 symbols, commonly called "chips." These "chips" resemble the waveform shown in FIG. 4A. Further imposed on this pattern is low rate data, transmitted from the satellite at 50 baud. All of this data is received at a very low signal-to-noise ratio as measured in a 2 MHz bandwidth. If the carrier frequency and all data rates were known to great precision, and no data were present, then the signal-to-noise ratio could be greatly improved, and the data greatly reduced, by adding to one another successive frames. For example; there are 1000 PN frames over a period of 1 second. The first such frame could be coherently added to the next frame, the result added to the third frame, etc. The result would be a signal having a duration of 1023 chips. The phasing of this sequence could then be compared to a local reference sequence to determine the relative timing between the two, thus establishing the so-called pseudorange.

The above process is typically carried out separately for each satellite in view from the same set of stored received data in the snapshot memory 9, since, in general, the GPS signals from different satellites have different Doppler frequencies and the PN patterns differ from one another.

The above process is made difficult by the fact that the carrier frequency may be unknown by in excess of 5 kHz due to signal Doppler uncertainty and by an additional amount due to receiver local oscillator uncertainty. These Doppler uncertainties are removed in one embodiment of the present invention by transmission of such information from a basestation 17 which simultaneously monitors all GPS signals from in view satellites. Thus, Doppler search is avoided at the remote unit 100. The focal oscillator uncertainty is also greatly reduced (to perhaps 50 Hz) by the AFC operation performed using the basestation to mobile unit communication signal (and the precision carrier frequency signal), as illustrated in FIG. 6.

The presence of 50 baud data superimposed on the GPS signal still limits the coherent summation of PN frames beyond a period of 20 msec. That is, at most 20 frames may be coherently added before data sign inversions prevent further processing gain. Additional processing gain may be achieved through matched filtering and summation of the magnitudes (or squares of magnitudes) of the frames, as detailed in the following paragraphs.

The flow chart of FIG. 3 begins at step 101 with a command from the basestation 17 to initialize a GPS processing operation (termed a "Fix Command" in FIG. 3). This command includes (in one embodiment) sending, over a communication link 14a, the Doppler shifts for each satellite in view and an Identification of those satellites. At step 102, the remote unit 100 computes its local oscillator drift by frequency locking to the signal transmitted from the basestation 17. An alternative would be to utilize a very good quality temperature compensated crystal oscillator in the remote unit. For example, digitally controlled TCXOs, so-called DCXOs, currently can achieve accuracy of about 0.1 parts per million, or an error of about 150 Hz for the L1 GPS signal.

Figure 8:
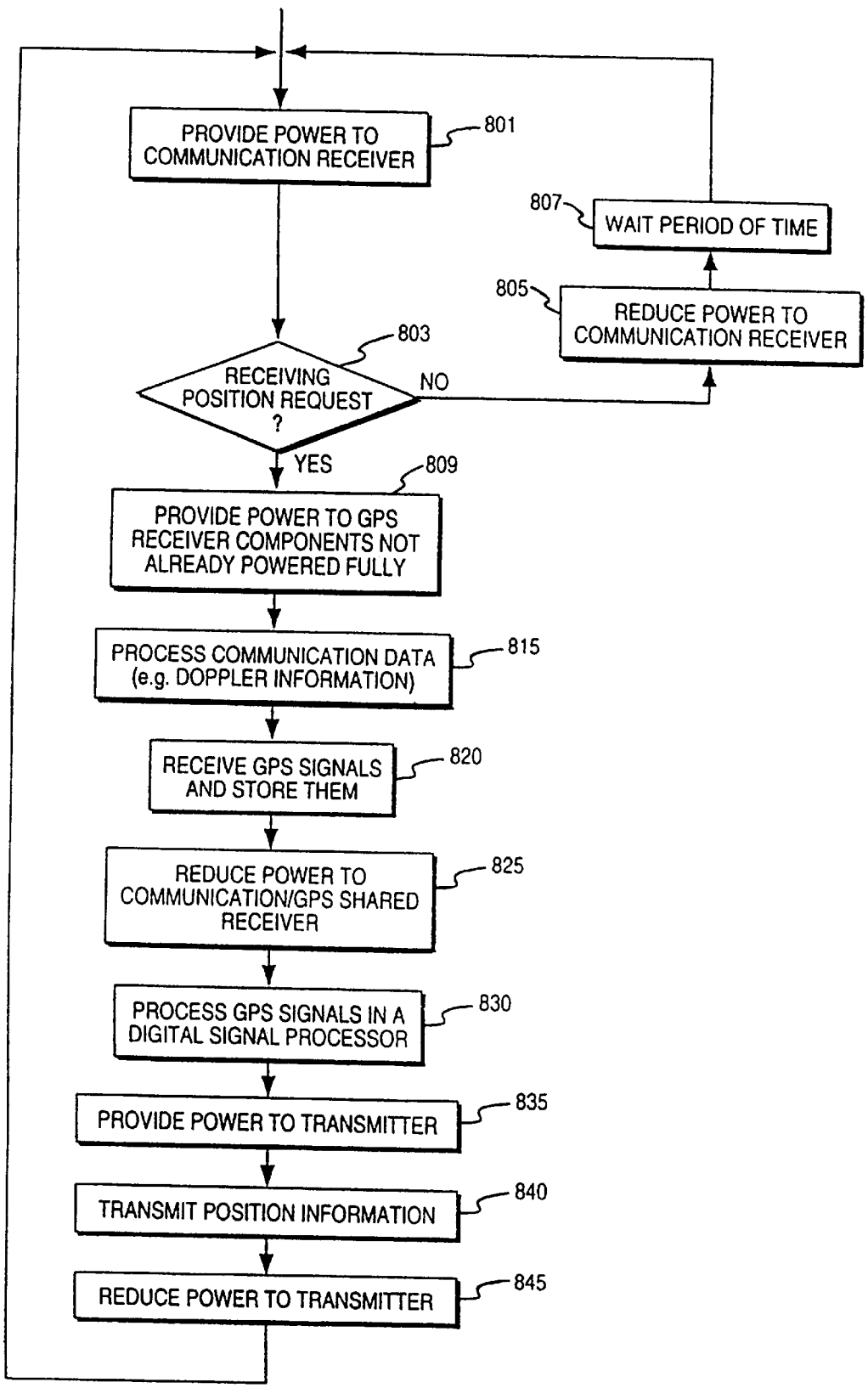
FIG. 8 is a flowchart which illustrates various steps involved in managing power consumption in a combined GPS and communication system according to one embodiment of the invention.

At step 104 the remote unit's processor 10 collects a snapshot of data of duration K PN frames of the C/A code, where K is typically 100 to 1000 (corresponding to 100 msec to 1 second time duration). When a sufficient amount of data has been collected, the processor 10 may reduce power consumed by the RF to IF converter 7 and the A/D converters 8 by placing these components in a reduced power state for at least a period of time (e.g. a short predetermined period of time). After this period of time, full power is typically provided again to these components in order to detect whether communication signals are being transmitted to the remote/mobile unit 100. This cycle of reduced and full power may be repeated as shown in FIG. 8 which is discussed below.

The pseudorange of each satellite is computed in turn as follows. First, at step 106 for the given GPS satellite signal to be processed, the corresponding pseudorandom code (PN) is retrieved from memory 19. As discussed shortly, the preferred PN storage format is actually the Fourier transform of this PN code, sampled at a rate of 2048 samples per the 1023 PN bits.

The data in snapshot memory 9 is processed in blocks of N consecutive PN frames, that is blocks of 2048N complex samples (N is an integer typically in the range 5 to 10). Similar operations are performed on each block as shown in the bottom loop (steps 108–124) of FIG. 3. That is, this loop is performed a total of K/N times for each GPS signal to be processed.

At step 108 the 2048N data words of the block are multiplied by a complex exponential that removes the effects of Doppler on the signal carrier, as well as the effects of drifting of the receiver's local oscillator. To illustrate, suppose the Doppler frequency transmitted from the basestation 17 plus local oscillator offsets corresponded to $f_e$ Hz. Then the premultiplication of the data would take the form of the function $e^{-j2\pi f_e nT}$, n=[0, 1, 2, . . . , 2048N −1]+(B−1)×

2048N, where T=1/2.048 MHz is the sampling period, and the block number B ranges from 1 to K/N.

Figure 4B:
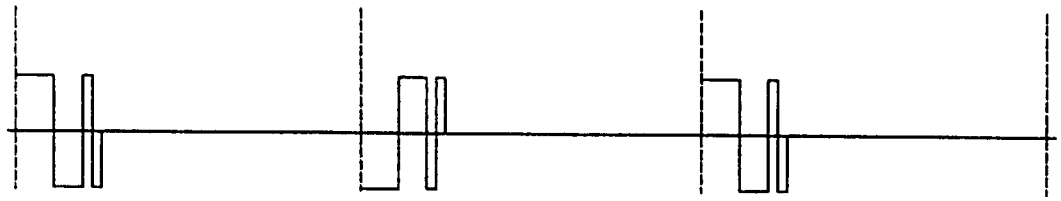

Next, at step 110, the adjacent groups of N (typically 10) frames of data within the block are coherently added to one another. That is, samples 0, 2048, 4096, . . . 2048(N−1)−1 are added together, then 1, 2049, 4097, . . . 2048(N−1) are added together, etc. At this point the block contains only 2048 complex samples. An example of the waveform produced by such a summing operation is illustrated in FIG. 4B for the case of 4 PN frames. This summing operation may be considered a preprocessing operation which precedes the fast convolution operations.

Next, at steps 112–118, each of the averaged frames undergoes a matched filtering operation, whose purpose is to determine the relative timing between the received PN code contained within the block of data and a locally generated PN reference signal. Simultaneously, the effects of Doppler on the sampling times is also compensated for. These operations are greatly speeded, in one embodiment, by the use of fast convolution operations such as Fast Fourier Transform algorithms used in a manner to perform circular convolution, as presently described.

In order to simplify discussion, the above mentioned Doppler compensation is initially neglected.

The basic operation to be performed is a comparison of the data in the block being processed (2048 complex samples) to a similar reference PN block stored locally. The comparison is actually done by (complex) multiplying each element of the data block by the corresponding element of the reference and summing the results. This comparison is termed a "correlation." However, an individual correlation is only done for one particular starting time of the data block, whereas there are 2048 possible positions that might provide a better match. The set of all correlation operations for all possible starting positions is termed a "matched filtering" operation. The full matched filtering operation is required in a preferred embodiment.

The other times of the PN block can be tested by circularly shifting the PN reference and reperforming the same operation. That is, if the PN code is denoted p(0) p(1) . . . p(2047), then a circular shift by one sample is p(1) p(2) . . . p(2047) p(0). This modified sequence tests to determine if the data block contains a PN signal beginning with sample p(1). Similarly the data block may begin with samples p(2), p(3), etc., and each may be tested by circularly shifting the reference PN and reperforming the tests. It should be apparent that a complete set of tests would require 2048×2048= 4,194,304 operations, each requiring a complex multiplication and addition.

Figure 4C:
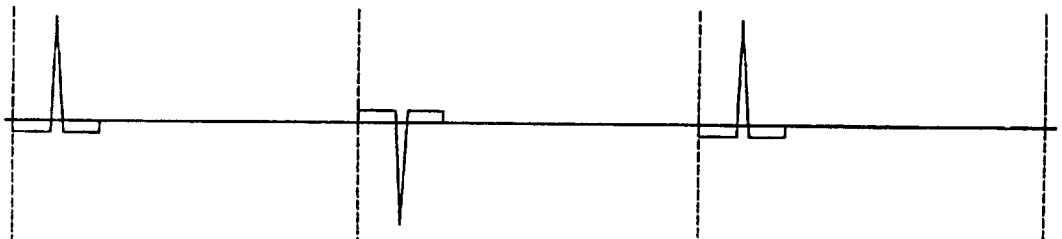

A more efficient, mathematically equivalent method may be employed, utilizing the Fast Fourier Transform (FFT), which only requires approximately 12×2048 complex multiplications and twice the number of additions. In this method, the FFT is taken for the data block, at step 112, and for the PN block. The FFT of the data block is multiplied by the complex conjugate of the FFT of the reference, at step 114, and the results are inverse Fourier transformed at step 118. The resulting data so gotten is of length 2048 and contains the set of correlations of the data block and the PN block for all possible positions. Each forward or inverse FFT operation requires $P/2 \log_2 P$ operations, where P is the size of the data being transformed (assuming a radix-2 FFT algorithm is employed). For the case of interest, B=2048, so that each FFT requires 11×1024 complex multiplications. However, if the FFT of the PN sequence is prestored in memory 19, as in a preferred embodiment, then its FFT need not be computed during the filtering process. The total number of complex multiplies for the forward FFT, inverse FFT and the product of the FFTs is thus (2×11+2)×1024= 24576, which is a savings of a factor of 171 over direct correlation. FIG. 4C illustrates the waveform produced by this matched filtering operation.

The preferred method of the current invention utilizes a sample rate such that 2048 samples of data were taken over the PN period of 1023 chips. This allows the use of FFT algorithms of length 2048. It is known that FFT algorithms that are a power of 2, or 4, are normally much more efficient than those of other sizes (and $2048=2^{11}$). Hence the sampling rate so chosen significantly improves the processing speed. It is preferable that the number of samples of the FFT equal the number of samples for one PN frame so that proper circular convolution may be achieved. That is, this condition allows the test of the data block against all circularly shifted versions of the PN code, as discussed above. A set of alternative methods, known in the art as "overlap save" or "overlap add" convolution may be utilized if the FFT size is chosen to span a number of samples different from that of one PN frame length. These approaches require approximately twice the number of computations as described above for the preferred implementation.

It should be apparent to one skilled in the art how the above process may be modified by utilizing a variety of FFT algorithms of varying sizes together with a variety of sample rates to provide fast convolution operations. In addition, a set of fast convolution algorithms exist which also have the property that the number of computations required are proportional to $B \log_2 B$ rather than $B^2$ as is required in straightforward correlation. Many of these algorithms are enumerated in standard references, for example, H. J. Nussbaumer, "Fast Fourier Transform and Convolution Algorithms," New York, Springer-Verlag, C1982. Important examples of such algorithms are the Agarwal-Cooley Algorithm, the split nesting algorithm, recursive polynomial nesting algorithm, and the Winograd-Fourier algorithm, the first three of which are used to perform convolution and the latter used to perform a Fourier transform. These algorithms may be employed in substitution of the preferred method presented above.

The method of time Doppler compensation employed at step 116 is now explained. In the preferred implementation, the sample rate utilized may not correspond exactly to 2048 samples per PN frame due to Doppler effects on the received GPS signal as well as local oscillator instabilities. For example, it is known that the Doppler shift can contribute a delay error of ±2700 nsec/sec. In order to compensate for this effect, the blocks of data processed in the above description need to be time shifted to compensate for this error. As an example, if the block size processed corresponds to 5 PN frames (5 msec), then the time shift from one block to another could be as much as ±13.5 nsec. Smaller time shifts result from local oscillator instability. These shifts may be compensated for by time shifting the successive blocks of data by multiples of the time shift required by a single block. That is, if the Doppler time shift per block is d, then the blocks are time shifted by nd, n=0, 1, 2, . . . .

In general these time shifts are fractions of a sample. Performing these operations directly using digital signal processing methods involves the use of nonintegral signal interpolation methods and results in a high computation burden. An alternative approach, that is a preferred method of the present invention, is to incorporate the processing within the fast Fourier transform functions. It is well-known that a time shift of d seconds is equivalent to multiplying the Fourier Transform of a function by $e^{-j2\pi f d}$, where f is the frequency variable. Thus, the time shift may be accomplished by multiplying the FFT of the data block by $e^{-j2\pi n d/T}f$ for n=0, 1, 2, ..., 1023 and by $e^{-j2\pi(n-2048)d/T}f$ for n=1024, 1025, ..., 2047, where $T_f$ is the PN frame duration (1 millisecond). This compensation adds only about 8% to the processing time associated with the FFT processing. The compensation is broken into two halves in order to guarantee continuity of phase compensation across 0 Hz.

Figure 4D:
Figure 4E:
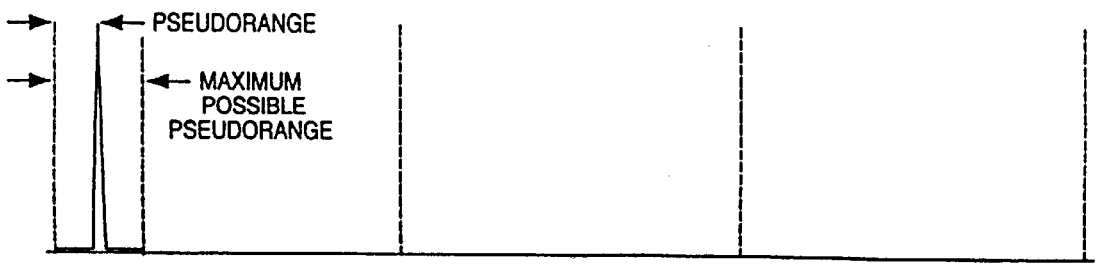

After the matched filtering operation is complete, the magnitudes, or magnitudes-squared, of the complex numbers of the block are computed at step 120. Either choice will work nearly as well. This operation removes effects of 50 Hz data phase reversals (as shown in FIG. 4D) and low frequency carrier errors that remain. The block of 2048 samples is then added to the sum of the previous blocks processed at step 122. Step 122 may be considered a post processing operation which follows the fast convolution operation provided by steps 112–118. This continues until all K/N blocks are processed, as shown by the decision block at step 124, at which time there remains one block of 2048 samples, from which a pseudorange is calculated. FIG. 4E illustrates the resulting waveform after the summing operation.

Pseudorange determination occurs at step 126. A peak is searched for above a locally computed noise level. If such a peak is found, its time of occurrence relative to the beginning of the block represents the pseudorange associated with the particular PN code and the associated GPS satellite.

An interpolation routine is utilized at step 126 to find the location of the peak to an accuracy much greater than that associated with the sample rate (2.048 MHz). The interpolation routine depends upon the prior bandpass filtering used in the RF/IF portion of the remote unit 100. A good quality filter will result in a peak having a nearly triangular shape with the width of the base equal to 4 samples. Under this condition, following subtraction of an average amplitude (to remove a DC baseline), the largest two amplitudes may be used to determine the peak position more precisely. Suppose these amplitudes are denoted $A_p$ and $A_{p+1}$, where $A_p \geq A_{p+1}$, without loss of generality, and p is the index of the peak amplitude. Then the position of the peak relative to that corresponding to $A_p$ may be provided by the formula: peak location=$p+A_p/(A_p+A_{p+1})$. For example if $A_p=A_{p+1}$, then the peak location is found to be p+0.5, that is, halfway between the indices of the two samples. In some situations the bandpass filtering may round the peak and a three point polynomial interpolation may be more suitable.

In the preceding processing, a local noise reference used in thresholding, may be computed by averaging all the data in the final averaged block, after removing the several largest such peaks.

Once the pseudorange is found, the processing continues at step 128 in a similar manner for the next satellite in view, unless all such satellites have been processed. Upon completion of the processing for all such satellites, the process continues at step 130 where the pseudorange data is transmitted to the basestation 17 over a communication link 14*a*. The final position calculation of the remote unit 100 is performed by the basestation in an embodiment of the invention where the basestation computes a latitude and longitude rather than the mobile unit 100. Finally, at step 132, at least some of the circuitry of the remote 100 (e.g. modulator 11, converter 12 and amplifier 13) is placed in a low power state, awaiting a new command to perform another positioning operation.

A summary of the signal processing described above and shown in FIG. 3 will now be provided. The GPS signals from one or more in view GPS satellites are received at the remote GPS unit using GPS antenna 1. These signals are digitized and stored in a buffer in the remote GPS unit. After storing these signals, a processor performs preprocessing, fast convolution processing, and post processing operations. These processing operations involve:

a) breaking the stored data into a series of contiguous blocks whose durations are equal to a multiple of the frame period of the pseudorandom (PN) codes contained within the GPS signals.

b) for each block performing a preprocessing step which creates a compressed block of data with length equal to the duration of a pseudorandom code period by coherently adding together successive subblocks of data, the subblocks having a duration equal to one PN frame; this addition step will mean that the corresponding sample numbers of each of the subblocks are added to one another.

c) for each compressed block, performing a matched filtering operation, which utilizes fast convolution techniques, to determine the relative timing between the received PN code contained within the block of data and a locally generated PN reference signal (e.g. the pseudorandom sequence of the GPS satellite being processed).

d) determining a pseudorange by performing a magnitude-squared operation on the products created from said matched filtering operation and post processing this by combining the magnitude-squared data for all blocks into a single block of data by adding together the blocks of magnitude-squared data to produce a peak.

and e) finding the location of the peak of said single block of data to high precision using digital interpolation methods, where the location is the distance from the beginning of the data block to the said peak, and the location represents a pseudorange to a GPS satellite corresponding to the pseudorandom sequence being processed.

Typically, the fast convolution technique used in processing the buffered GPS signals is a Fast Fourier Transform (FFT) and the result of the convolution is produced by computing the product of the forward transform of the compressed block and a prestored representation of the forward transform of the pseudorandom sequence to produce a first result and then performing an inverse transformation of the first result to recover the result. Also, the effects the Doppler induced time delays and local oscillator induced time errors are compensated for on each compressed block of data by inserting between the forward and inverse Fast Fourier Transform operations, the multiplication of the forward FFT of the compressed blocks by a complex exponential whose phase versus sample number is adjusted to correspond to the delay compensation required for the block.

In the foregoing embodiment the processing of GPS signals from each satellite occurs sequentially over time, rather than in parallel. In an alternative embodiment, the GPS signals from all in view satellites may be processed together in a parallel fashion in time.

It is assumed here that the basestation 17 has a common view of all satellites of interest and that it is sufficiently close in range to remote unit 100 in order to avoid ambiguities associated with the repetition period of the C/A PN code. A range of 90 miles will satisfy this criteria. The basestation 17 is also assumed to have a GPS receiver, and a good geographical location such that all satellites in view are continuously tracked to high precision.

While several described embodiments of the basestation 17 show the use of a data processing component, such as a computer at the basestation in order to compute position information such as a latitude and a longitude for the mobile GPS unit, it will be appreciated that each basestation 17 may merely relay the information received, such as pseudoranges from a mobile GPS unit, to a central location or several central locations which actually perform the computation of latitude and longitude. In this manner the cost and complexity of these relaying basestations may be reduced by eliminating a data processing unit and its associated components from each relaying basestation. A central location, would include receivers (e.g. telecommunication receivers) and a data processing unit and associated components. Moreover, in certain embodiments, the basestation may be virtual in that it may be a satellite which transmits Doppler information to remote units, thereby emulating a basestation in a transmission cell.

Figure 5A:
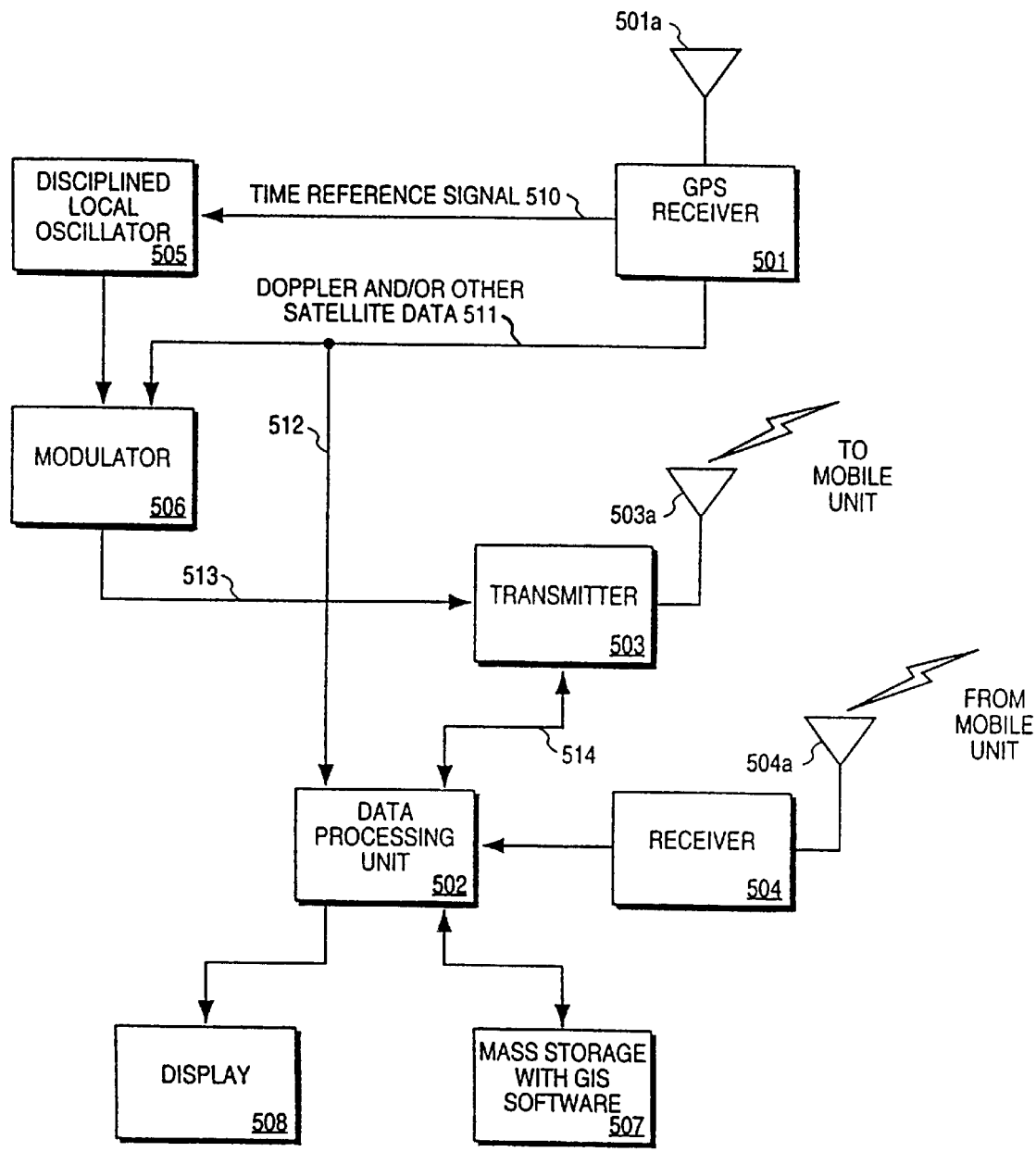
FIG. 5A illustrates a basestation system in one embodiment of the present invention.
Figure 5B:
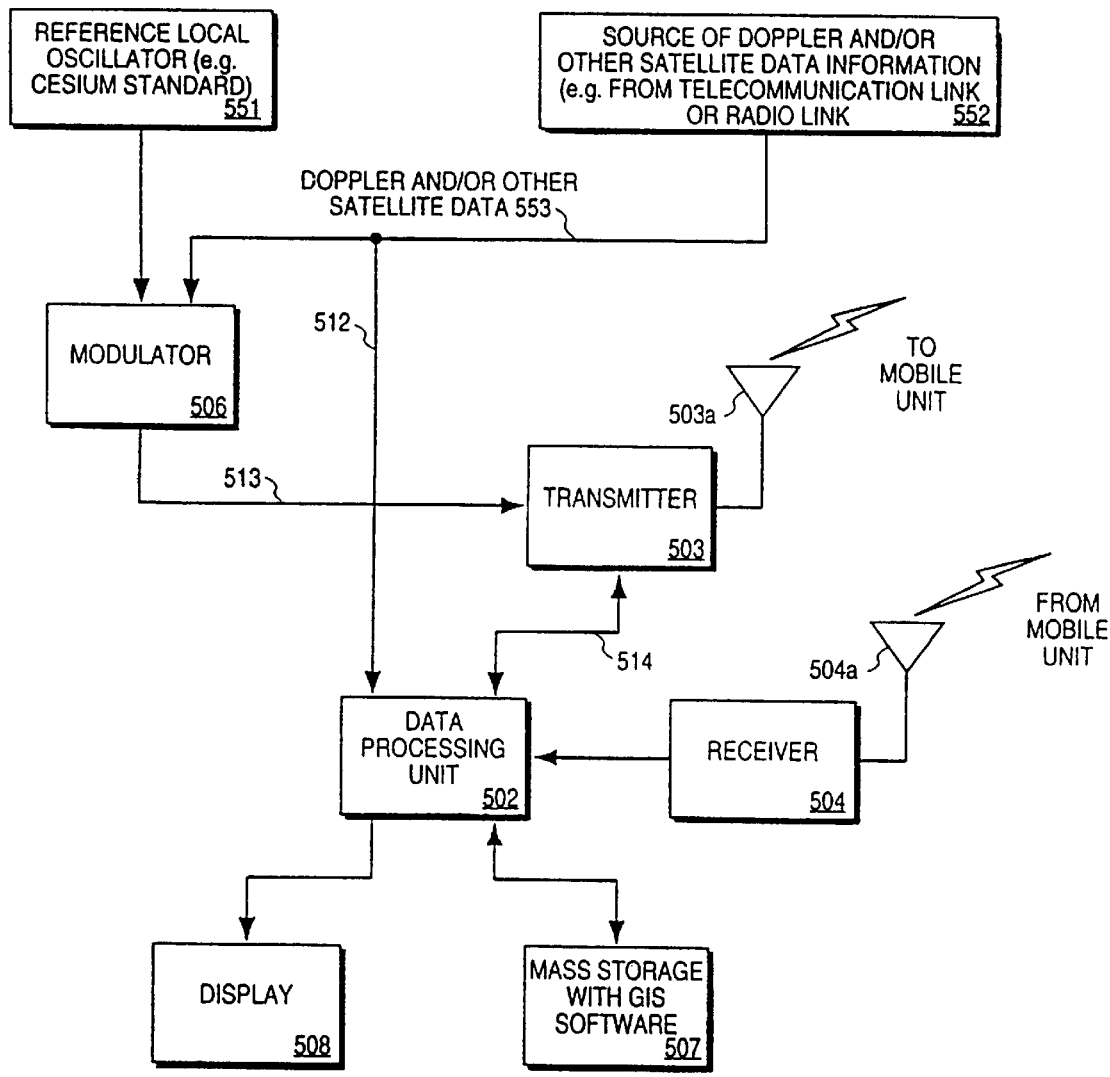
FIG. 5B illustrates a basestation in an alternative embodiment of the present invention.

FIGS. 5A and 5B show two embodiments of a basestation according to the present invention. In the basestation shown in FIG. 5A, a GPS receiver 501 receives GPS signals through a GPS antenna 501a. The GPS receiver 501, which may be a conventional GPS receiver, provides a timed reference signal which typically is timed relative to GPS signals and also provides Doppler information relative to the satellites in view. This GPS receiver 501 is coupled to a disciplined local oscillator 505 which receives the time reference signal 510 and phase locks itself to this reference. This disciplined local oscillator 505 has an output which is provided to a modulator 506. The modulator 506 also receives Doppler data information signals for each satellite in view of the GPS mobile unit and/or other satellite data information signals (e.g. data representative of satellite ephemeris) via interconnect 511. The modulator 506 modulates the Doppler and/or other satellite data information onto the local oscillator signal received from the discipline local oscillator 505 in order to provide a modulated signal 513 to the transmitter 503. The transmitter 503 is coupled to the data processing unit 502 via interconnect 514 such that the data processing unit may control the operation of the transmitter 503 in order to cause the transmission of satellite data information, such as the Doppler information to a GPS mobile unit (e.g. remote unit 100 having shared circuitry) via the transmitter's antenna 503a. In this manner, a GPS mobile unit may receive the Doppler information, the source of which is the GPS receiver 501 and may also receive a high precision local oscillator carrier signal which may be used to calibrate the local oscillator in the GPS mobile unit as shown in FIG. 6.

The basestation as shown in FIG. 5A also includes a receiver 504 which is coupled to receive communication signals from the remote unit 100 via a communication antenna 504a. It will be appreciated that the antenna 504a may be the same antenna as the transmitters antenna 503a such that a single antenna serves both the transmitter and the receiver in the conventional fashion. The receiver 504 is coupled to the data processing unit 502 which may be a conventional computer system. The processing unit 502 may also include an interconnect 512 to receive the Doppler and/or other satellite data information from the GPS receiver 511. This information may be utilized in processing the pseudorange information or other information received from the mobile unit 100 via the receiver 504. This data processing unit 502 is coupled to a display device 508, which may be a conventional CRT. The data processing unit 502 is also coupled to a mass storage device 507 which includes GIS (Geographical Information System) software (e.g. Atlas GIS from Strategic Mapping, Inc. of Santa Clara, Calif.) which is used to display maps on the display 508. Using the display maps, the position of the mobile GPS unit 100 may be indicated on the display relative to a displayed map.

An alternative basestation shown in FIG. 5B includes many of the same components shown in FIG. 5A. However, rather than obtaining Doppler and/or other satellite data information from a GPS receiver, the basestation of FIG. 5B includes a source of Doppler and/or other satellite data information 552 which is obtained from a telecommunication link or a radio link in a conventional matter. This Doppler and/or satellite information is conveyed over an interconnect 553 to the modulator 506. The other input to the modulator 506 shown in FIG. 5B is the oscillator output signal from a reference quality local oscillator 551 such as a cesium standard local oscillator. This reference local oscillator 551 provides a precision carrier frequency onto which is modulated the Doppler and/or other satellite data information which is then transmitted via transmitter 503 to the mobile GPS unit.

FIG. 6 shows an embodiment of a GPS mobile unit of the present invention which utilizes the precision carrier frequency signal received through the communication channel antenna 601 which is similar to the antenna 2 shown in FIG. 1A. Similarly, it will be appreciated that GPS antenna 613 may be the same as antenna 1 in FIG. 1A, and converter 614, A/D converter 616, memory 618 and DSP component 620 represent respectively converter 7, A/D converter 8, memory 9, and DSP component 10 in FIG. 1A. The frequency synthesizer 609 and local oscillator 606 represent respectively synthesizer 42 and frequency reference 43 shown in FIG. 1B. In this embodiment, during reception of communication signals, the DSP component 620 computes the tuning error from the precision carrier frequency signal and sends tuning corrections 610 to the frequency synthesizer 609. These tuning corrections may then be used to determine the initial tuning error, and hence the error in the local oscillator signal 607, assuming that the received communications signal has a very stable carrier frequency. The local oscillator error may then be compensated during a subsequent GPS reception operation by offsetting the frequency synthesizer 609's tuning frequency by an amount that negates the effect of the local oscillator error from local oscillator 606.

Figure 7A:
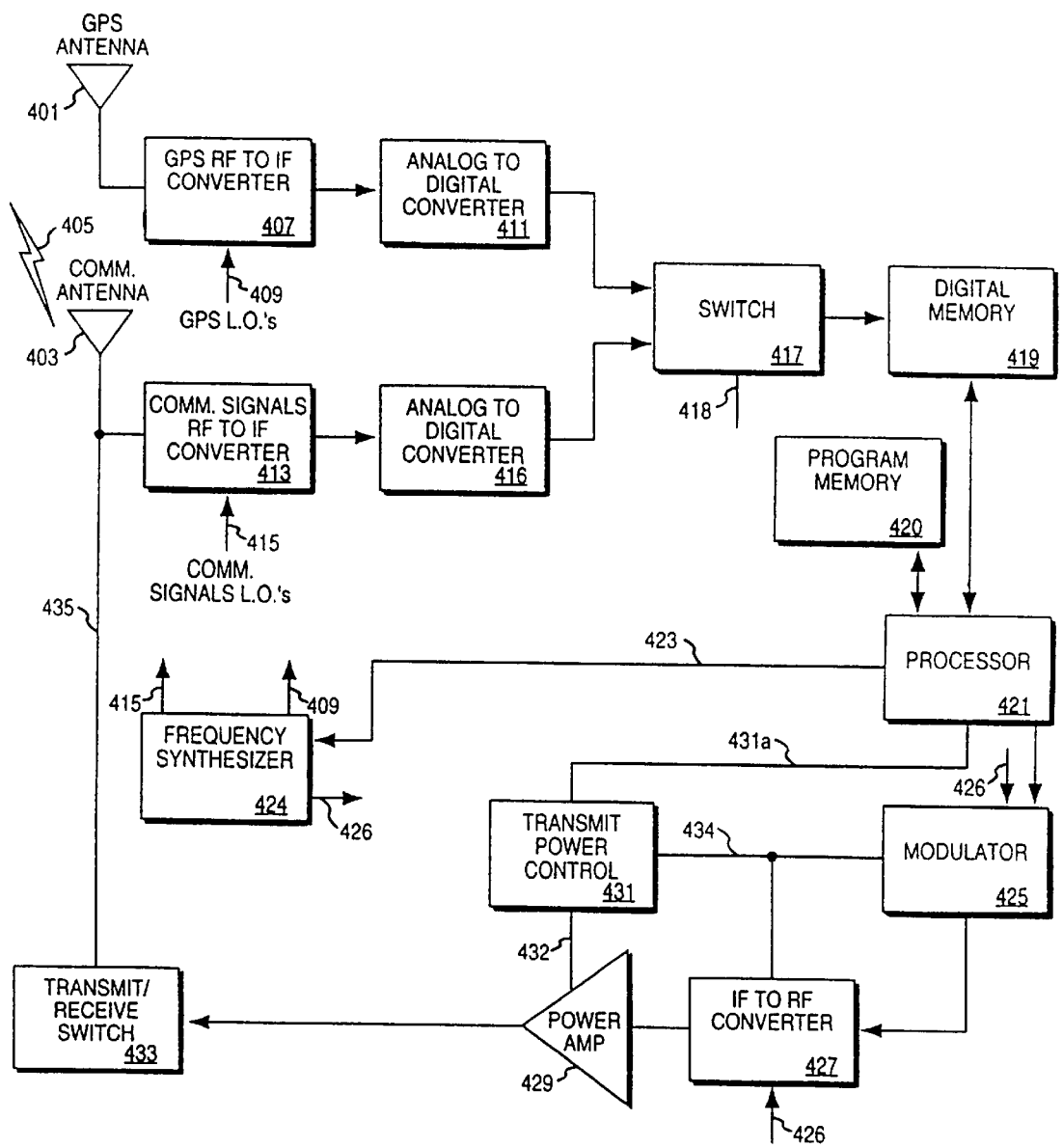
FIG. 7A is a depiction of a combined GPS and communication system according to an alternative embodiment of the present invention.
Figure 7B:
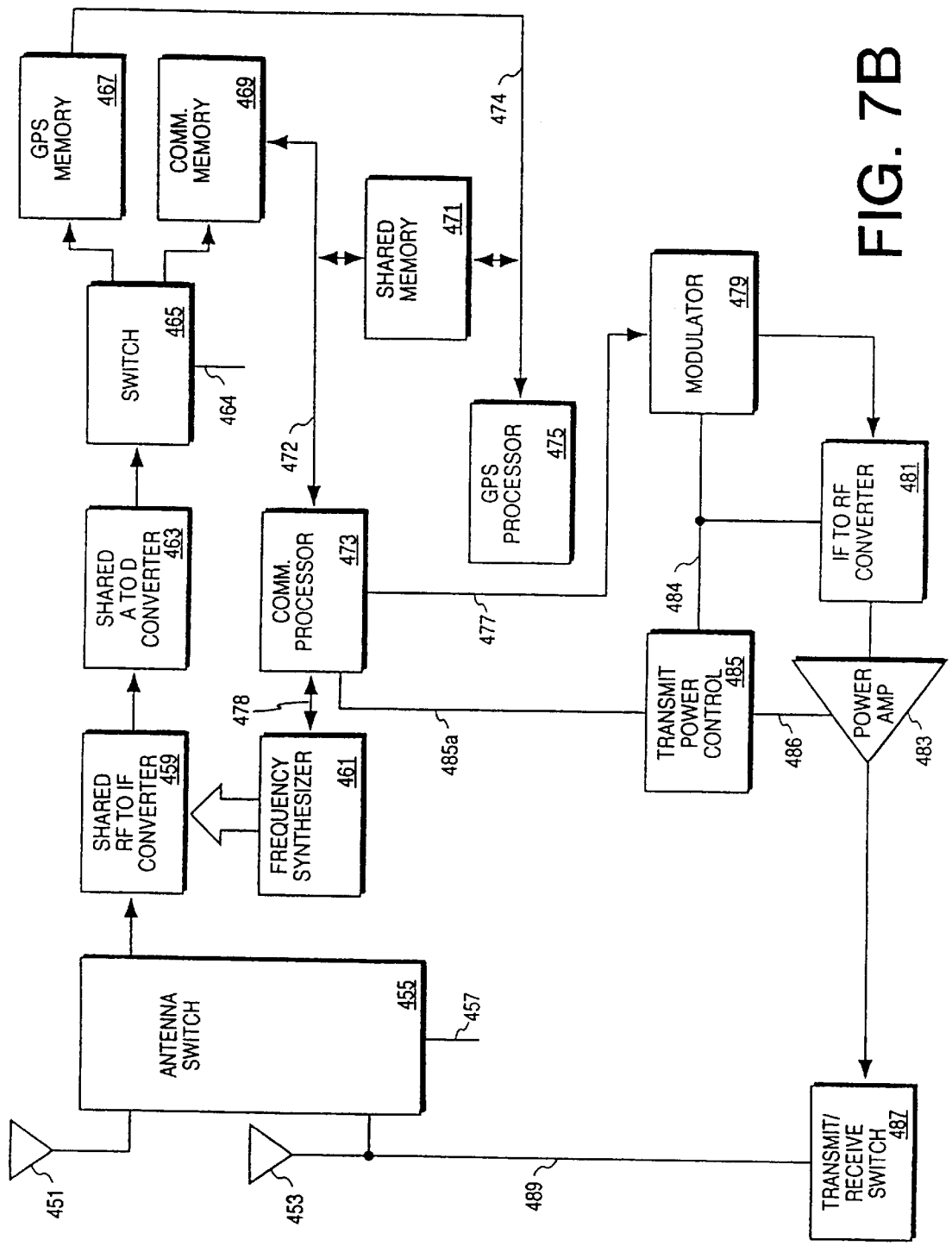
FIG. 7B shows a combined GPS and communication system according to another embodiment of the present invention.

FIGS. 7A and 7B show alternative embodiments of the present invention which utilize shared components. As shown in FIG. 7A, the processor 421 (e.g. a DSP IC) is shared between two separate receiver sections. In particular, the converter 407, antenna 401, and converter 411 form the GPS receiver section, and the converter 413, antenna 403 and the converter 416 provide the communication receiver section. The output signals from these two receivers are selected by the switch 417 under control of the processor 421 through the select line 418 of the switch 417. The output from this switch 417 is coupled to an input of the digital memory 419 which is coupled to the processor 421 by a bi-directional bus. A memory 420 stores computer programs and data which control the operations of the processor 10, and this memory is coupled to the processor 10. The processor controls frequency synthesizer 424 through the control line 423. The frequency synthesizer 424 provides various local oscillator signals 409 and 415 for use by the converters 407 and 413, respectively and also provides local oscillator signals 426 to the modulator 425 and the converter 427. When the processor desires to transmit a message through the communication link 405 via communication antenna 403, the processor sends data to the modulator 425 and the modulated data is then converted in the converter 427 and amplified by the power amplifier 429. The operation of the modulator 425 and the converter 427 and the amplifier 429 is similar to that described above for modulator 11, converter 12 and amplifier 13 of FIG. 1A. FIG. 7A may be most appropriate for use with certain cellular communications systems, such as the analog North American AMPS system, in which a telephone conversation and a GPS operation may be occurring concurrently. In this situation it may be Impossible to share the converters; however, the frequency synthesizer, digital memory and digital processor may be shared in order to save, size, cost and power. In this case the frequency synthesizer is one that can provide a multiplicity of local oscillators from a single reference source such that local oscillator signals are simultaneously provided for several concurrent operations (e.g. telephone signal reception and transmission and GPS signal reception).

The processor 421 controls power consumption in the combined GPS and communication system shown in FIG. 7A by, in one embodiment, reducing power consumed by the transmitter section which includes the modulator 425, IF to RF converter 427 and the power amplifier 429. This power reduction is achieved by the transmit power control 431 which provides controlled power to this transmitter section through interconnects 432 and 434; the processor 421, through control signals on interconnect 431a, instructs the transmit power control 431 to provide full power or reduced power in accordance with the operational mode of the transmitter. In a similar manner, the processor 421, under control of a power management program stored in the memory 420 (which may be an EPROM or EEPROM memory), may place the GPS receiver section in a reduced power consumption mode when GPS signals are not being received. For example, power may not be provided, in the reduced power consumption mode, to converters 407 and 411.

FIG. 7B shows another embodiment accordingly to the present invention wherein the receiver portions are shared but the processing portions are not. The receiver portion shown in FIG. 7B is similar to the receiver portion shown in FIG. 1A, where the converter 459, converter 463 and frequency synthesizer 461 provide the essential components of both GPS and communication signal receiver sections and are shared between both receiver sections. The transmitter portion shown in FIG. 7B is also similar to the transmitter portion shown in FIG. 1A, and includes the modulator 479, the IF to RF converter 481, the power amplifier 483, the transmit power control 485 and the switch 487. The frequency synthesizer 461 also provides local oscillator signals to the modulator 479 and the IF to RF converter 481 in the transmitter portion shown in FIG. 7B. However, as shown in FIG. 7B, there are two separate processors for processing the two functions of the combined system. Communication processor 473 controls processing (e.g. demodulation and modulation) of the communication signals while the GPS processor 475 processes the GPS signals; the results (e.g. a position information) of the processing of GPS signals are communicated through the shared memory 471 to the communication processor 473 which then communicates a position information through interconnect 477 to the transmitter portion which comprises modulator 479, converter 481, power amplifier 483 and the transmit/receiver switch 487. The processor 473 in the embodiment shown in FIG. 7B controls the switching of the frequency synthesizer 461 between the various operational modes (e.g. communication receive or GPS receive). The processor 473 typically also controls the switching of switch 465 (through control line 464) so that GPS signals are stored in the GPS memory 467 (when the shared receiver is operating in GPS reception mode) and so that communication signals are stored in the communication memory 469 when the shared receiver is operating in the communication signal reception mode.

FIG. 7B may be appropriate to systems such as two-way pagers and similar such systems, in which the communications reception operation and the GPS reception operation need not be concurrent. Here, most of the RF chain and the A/D converter may be shared. FIG. 7B, unlike FIG. 1A, however, provides for separate digital processors, as may be necessary, if the combined processing burden of the GPS and communications processing functions are too severe to allow completion within a desired time period. As with the system shown in FIG. 7A, reduction of power consumption may be achieved by the processor 473 causing the reduction of power consumed by the transmitter portion through the transmit power control 485.

FIG. 8 illustrates a typical method according to the invention for conserving and reducing power consumption in a combined GPS and communication system having shared circuitry. As an example, the method of FIG. 8 will be described for the combined system shown in FIG. 1A. This method typically operates by the processor 10 controlling power reduction under control of a program stored in memory 19. Power reduction is typically achieved by controlling power interconnects to various components. For example, the transmitter section receives power controlled interconnects through a transmit power control 18. Similarly, the receiver section may receive power through power controlled interconnects (not shown) which provide power to components (e.g. converters 7 and 8) in the shared receiver section. It will be appreciated that in some applications power may be provided without interruption to the reference oscillators and phase lock loops (PLL) in the frequency synthesizer since these components require some time to stabilize after power is first provided. The method begins at step 801, where full power is provided to the communication receiver; this receiver includes the RF to IF converter 7 and the A/D converter 8 and the preselect filter 4. Any communication signals received during this time are stored in memory 9 and demodulated by processor 10.

The processor 10 determines in step 803 whether the communication signals during step 801 include a request to provide position information of the combined system; this request is also referred to as a "fix command". If no such request is received, power to the communication receiver is reduced in step 805 and the processor 10, in step 807, waits a period of time (e.g. a predetermined period of time) before returning to step 801. If such a request is received, the processor 10 causes, in step 809, full power to be provided to components of the shared GPS/communication receiver which have not already received full power; an example of such components includes the preselect filter 3 (which may include a low noise amplifier) which may remain in a reduced power state while the communication signals are received. The processor 10, in step 815, processes any communication data received by the communication receiving operation. Such data may include satellite Doppler information for satellites in view and an identification of these satellites. Then in step 820, the GPS receiver of the shared GPS/Communication receiver receives the GPS signals from the satellites in view and digitized versions of the signals are stored in memory 9. Processor 10 then causes the power consumed by the shared GPS/Communication receiver (e.g. converters 7 and 8) to be reduced in step 825, and in step 830, the processor 10 processes the stored GPS signals. After the processor 10 determines a position information (e.g. pseudoranges to a plurality of satellites in view or a latitude and longitude of the combined system), the processor 10 causes, in step 835, power to be provided to the transmitter section by instructing the transmit power control 18 to provide full power to the modulator 11, converter 12 and power amplifier 13. Then the transmitter, in step 840 transmits the position information and then, in step 845, power provided to the transmitter section is reduced. Processing then returns back to step 801 to continue from this point.

In the foregoing specification the invention has been described with reference to specific explementary embodiment thereof. It will however be evident that various modifications and changes may be made thereto without departing from the broader spirit and scope of the invention as set forth in the pending claims. The specification and drawings are, accordingly, to be regarded in an illustrative rather than a restrictive sense.

What is claimed is:

1. A method for performing Global Positioning System (GPS) functions and cellular communication functions in an integrated communication system, said method comprising:

converting radio frequency (RF) GPS signals and RF cellular communication signals in a shared RF to intermediate frequency (IF) converter, wherein said shared RF to IF converter converts said RF GPS signals from a first frequency to a second frequency which is lower than said first frequency and said shared RF to IF converter converts said RF cellular communication signals from a third frequency to a fourth frequency which is lower than said third frequency, and wherein said shared RF to IF converter comprises a shared frequency mixer which converts said RF GPS signals to said second frequency and which converts said RF cellular communication signals to said fourth frequency.

2. A method as in claim 1 wherein said shared RF to IF converter performs a final frequency conversion on both said RF GPS signals and said RF cellular communication signals.

3. A method as in claim 1 wherein said first frequency and said third frequency are different by more than 100 MHz.

4. A method as in claim 2 wherein GPS signals at said second frequency and cellular communication signals at said fourth frequency are filtered or amplified in said shared RF to IF converter after said final frequency conversion.

5. A method as in claim 4 wherein said shared RF to IF converter provides a shared signal path in said shared RF to IF converter for both said RF GPS signals and said RF cellular communication signals.

6. A method as in claim 2 further comprising:

converting, in a shared analog to digital (A/D) converter, GPS signals at said second frequency, from said shared RF to IF converter, to digitized GPS signals;

converting, in said shared A/D converter, cellular communication signals, from said shared RF to IF converter, to digitized cellular communication signals.

7. A method as in claim 1 wherein said shared RF to IF converter is selectably tunable to (a) convert from said first frequency to said second frequency; and (b) convert from said third frequency to said fourth frequency.

8. A method as in claim 1 wherein said RF cellular communication signals comprise at least one of a Doppler information of a GPS satellite in view of said integrated communication system and data representative of ephemeris for a GPS satellite in view of said integrated communication system.

9. An integrated communication system having a Global Positioning System (GPS) receiver which is coupled to a cellular communication system, said integrated communication system comprising:

a shared radio frequency (RF) to intermediate frequency (IF) converter which is coupled to receive RF GPS signals and is coupled to receive RF cellular communication signals, said shared RF to IF converter having a shared frequency mixer which converts said RF GPS signals from a first frequency to a second frequency which is lower than said second frequency, and said shared frequency mixer converting said RF cellular communication signals from a third frequency to a fourth frequency which is lower than said third frequency.

10. An integrated communication system as in claim 9 wherein said shared frequency mixer has a first input for receiving said RF cellular communication signals and said RF GPS signals and has a second input for receiving at least one reference signal and has an output for providing IF GPS signals to said GPS receiver and for providing IF cellular communication signals to said cellular communication system.

11. An integrated communication system as in claim 9 wherein said shared frequency mixer performs a final frequency conversion on both said RF GPS signals and said RF cellular communication signals.

12. An integrated communication system as in claim 10 further comprising:

a shared analog to digital (A/D) converter coupled to said shared RF to IF converter to receive said IF GPS signals and to receive said IF cellular communication signal, said shared A/D converter converting said IF GPS signals to digitized GPS signals for processing in said GPS receiver and converting said IF cellular communication signals to digitized cellular communication signals for processing in said cellular communication system.

13. An integrated communication system as in claim 10 wherein said shared frequency mixer is selectable tunable to (a) convert from said first frequency to said second frequency and (b) convert from said third frequency to said fourth frequency.

14. An integrated communication system as in claim 9 wherein said RF cellular communication signals comprise at least one of a Doppler information of a GPS satellite in view of said integrated communication system and data representative of ephemeris for a GPS satellite in view of said integrated communication system.

15. An integrated communication system having a Global Positioning System (GPS) receiver which is coupled to a cellular communication system, said integrated communication system comprising:

a shared analog to digital (A/D) converter coupled to receive GPS signals and to receive cellular communication signals, said shared A/D converter converting said GPS signals to digitized GPS signals for processing in said GPS receiver and converting said cellular communication signals to digitized cellular communication signals for processing in said communication system.

16. An integrated communication system as in claim 15 further comprising:

a digital signal processor (DSP) coupled to said shared A/D converter to receive said digitized cellular com munication signals, said DSP demodulating said digitized cellular communication signals.

17. An integrated communication system as in claim 16 wherein said DSP receives said digital GPS signals and processes said digital GPS signals.

18. A method for performing Global Positioning System (GPS) functions and cellular communication functions in an integrated communication system, said method comprising:

processing GPS signals and cellular communication signals in a shared circuitry, said processing in said shared circuitry being after a final frequency conversion of said GPS signals and after a final frequency conversion of said cellular communication signals and prior to digitization of said GPS signals and prior to digitization of said cellular communication signals, said processing being performed in order to determine the message content of said GPS signals and said cellular communication signals.

\* \* \* \* \*